(12) United States Patent
She et al.

(10) Patent No.: US 12,187,656 B2
(45) Date of Patent: Jan. 7, 2025

(54) CERAMIC MATRIX COMPOSITE TOOLING FOR CHEMICAL VAPOR INFILTRATION PROCESS

(71) Applicant: Raytheon Technologies Corporation, Farmington, CT (US)

(72) Inventors: Ying She, Rocky Hill, CT (US); Afshin Bazshushtari, Rolling Hills Estates, CT (US); Sergio Calabrese, Vista, CA (US); Douglas F. Long, Mission Viejo, CA (US); Andrew Joseph Lazur, La Jolla, CA (US)

( * ) Notice: Subject to any disclaimer, the term of this patent is extended or adjusted under 35 U.S.C. 154(b) by 0 days.

(21) Appl. No.: 17/957,628

(22) Filed: Sep. 30, 2022

(65) Prior Publication Data

US 2024/0109816 A1 Apr. 4, 2024

(51) Int. Cl.
*C04B 35/52* (2006.01)
*C04B 41/45* (2006.01)

(52) U.S. Cl.
CPC ........ *C04B 41/457* (2013.01); *C04B 41/4531* (2013.01); *C04B 2235/614* (2013.01)

(58) Field of Classification Search
CPC .............. C04B 41/457; C04B 41/4531; C04B 2235/614
See application file for complete search history.

(56) References Cited

U.S. PATENT DOCUMENTS

| | | | |
|---|---|---|---|
| 5,065,696 A | 11/1991 | Greenberg et al. | |
| 5,209,525 A * | 5/1993 | Ito | C04B 37/005 285/911 |
| 5,480,678 A | 1/1996 | Rudolph et al. | |
| 6,669,988 B2 | 12/2003 | Daws et al. | |
| 7,691,443 B2 | 4/2010 | Rudolph et al. | |
| 10,906,205 B2 | 2/2021 | Thibaud et al. | |
| 2008/0314966 A1 | 12/2008 | Elston et al. | |
| 2009/0095221 A1* | 4/2009 | Tam | C23C 16/45565 118/715 |
| 2014/0363327 A1* | 12/2014 | Holcomb | B23K 37/0461 219/76.1 |
| 2016/0196956 A1 | 7/2016 | Zhang et al. | |
| 2017/0036400 A1* | 2/2017 | Loeffler | B29C 64/245 |

(Continued)

FOREIGN PATENT DOCUMENTS

| CN | 110261256 A | 9/2019 |
|---|---|---|
| CN | 110978569 A | 4/2020 |

(Continued)

OTHER PUBLICATIONS

CN_110978569, Xu, Eng machine translation, Oct. 2020 (Year: 2020).*

(Continued)

*Primary Examiner* — Joseph A Miller, Jr.
(74) *Attorney, Agent, or Firm* — Kinney & Lange, P.A.

(57) ABSTRACT

A tooling assembly suitable for use in infiltrating a fibrous preform comprises a first perforated plate having an outer surface and an oppositely disposed inner surface defining a plate thickness therebetween, and a plurality of tapered holes extending through the thickness. Each hole of the plurality of tapered holes has a first diameter at the outer surface and a second diameter at the inner surface, and the first diameter is greater than the second diameter.

17 Claims, 2 Drawing Sheets

(56) References Cited

U.S. PATENT DOCUMENTS

2019/0322004 A1 10/2019 White et al.
2021/0053122 A1* 2/2021 Socha .................... B33Y 40/00
2021/0101841 A1 4/2021 Ritchey
2021/0381384 A1 12/2021 Barker

FOREIGN PATENT DOCUMENTS

CN 115008791 A 9/2022
EP 3805424 A1 4/2021

OTHER PUBLICATIONS

Extended European Search Report for EP Application No. 23201057.9, dated Feb. 15, 2024, 6 pages.
Extended European Search Report for EP Application No. 23199553.1, dated Mar. 1, 2024, 7 pages.
Extended European Search Report for EP Application No. 23199556.4, dated Mar. 1, 2024, 7 pages.

* cited by examiner

CERAMIC MATRIX COMPOSITE TOOLING FOR CHEMICAL VAPOR INFILTRATION PROCESS

BACKGROUND

The present invention relates to chemical vapor infiltration (CVI), and more particularly to improved tooling for CVI.

Ceramic matrix composite (CMC) parts are widely fabricated by densifying preforms made from woven fabrics or oriented fiber tows. Chemical vapor infiltration (CVI) is one of the most commonly used densification techniques practiced in industry. To keep the preforms in a rigid form and maintain proper shape and geometry, perforated tooling can be used to hold the preforms during the initial densification cycle(s). Holes on the tooling allow vaporous precursors to infiltrate into the preform for the deposition. However, deposition of precursors within the holes over multiple uses can cause clogging, limiting reuse. Thus, a need exists for improved tooling.

SUMMARY

A tooling assembly suitable for use in infiltrating a fibrous preform comprises a first perforated plate having an outer surface and an oppositely disposed inner surface defining a plate thickness therebetween, and a plurality of tapered holes extending through the thickness. Each hole of the plurality of tapered holes has a first diameter at the outer surface and a second diameter at the inner surface, and the first diameter is greater than the second diameter.

A method of forming a tooling assembly suitable for use in infiltrating a fibrous preform comprises forming a first perforated plate, the first perforated plate having an outer surface and an oppositely disposed inner surface defining a plate thickness therebetween, and a plurality of tapered holes extending through the thickness. Each hole of the plurality of tapered hole has a first diameter at the outer surface and a second diameter at the inner surface, and the first diameter is greater than the second diameter.

A tooling assembly suitable for use in infiltrating a fibrous preform comprises a a plurality of perforated plates, each having an outer surface and an oppositely disposed inner surface defining a plate thickness therebetween, and a plurality of tapered holes extending through the thickness. Each hole of the plurality of tapered holes has a first diameter at the outer surface and a second diameter at the inner surface, and the first diameter is greater than the second diameter.

Figure 1:
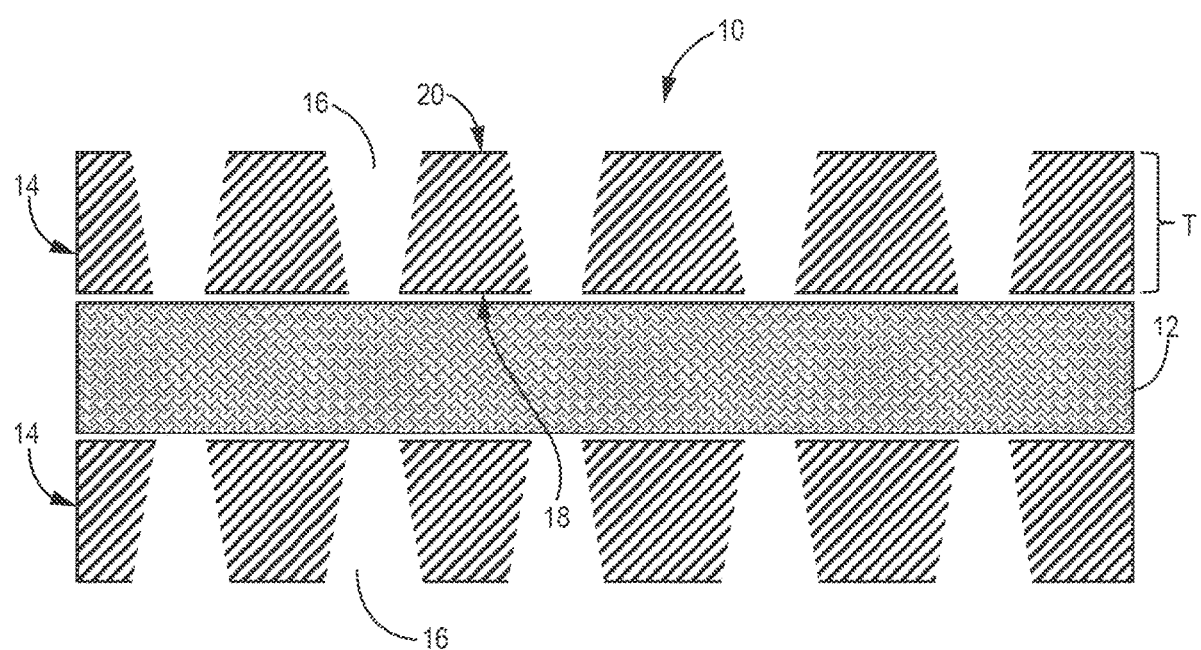
FIG. 1 is a simplified cross-sectional illustration of a fibrous preform mounted in a tooling assembly.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents CVI tooling with tapered hole geometries. The holes can be formed using various subtractive manufacturing techniques (e.g., drilling or counterboring). These hole geometries include larger diameters at hole entrances to extends the life cycle of the tooling by reducing obstruction of the holes from reactant deposition during CVI.

FIG. 1 is a simplified cross-sectional illustration of tooling assembly 10 disposed around fibrous preform 12. As shown, tooling assembly 10 includes a plurality (e.g., two) perforated plates 14 with a generally planar geometry to compliment the geometry of preform 12. In an alternative embodiment, tooling assembly 10 can additionally and/or alternatively include curved pieces for enclosing, for example, airfoil shaped preforms. Each plate 14 includes tapered holes 16 extending through its thickness T, defined as the dimension extending between inner, preform-facing surface 18 and oppositely disposed outer surface 20. Thickness T can range from 0.25 in (6.35 mm) to 1.0 in (25.4 mm) in an exemplary embodiment. Thickness T can be generally uniform across a given plate 14, or can vary, for example, having relatively thicker or thinner regions. Holes 16 can be arranged in an array, that is, in rows and columns throughout each plate 14. Other arrangements are contemplated herein.

In an exemplary embodiment, preform 12 can be formed from tows of silicon carbide (SiC) fibers arranged in one of various two or three-dimensional woven architectures such as plain, harness (e.g., 3, 5, 8, etc.), twill, braid, or non-symmetric to name a few non-limiting examples. In an alternative embodiment, preform 12 can be formed from non-woven (e.g., chopped, felted, etc.) fibers. Plates 14 can be formed from graphite in an exemplary embodiment, and in alternative embodiments, can be at least partially formed from alternative, non-graphitic forms of carbon (e.g., carbon-carbon composites) and/or ceramics (e.g., SiC).

Figure 2A:
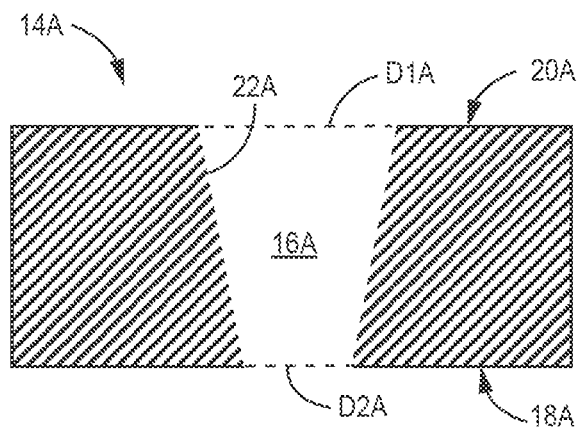
FIGS. 2A, 2B, and 2C are simplified cross-sectional illustrations of alternative hole geometries of the tooling assembly of FIG. 1.
Figure 2B:
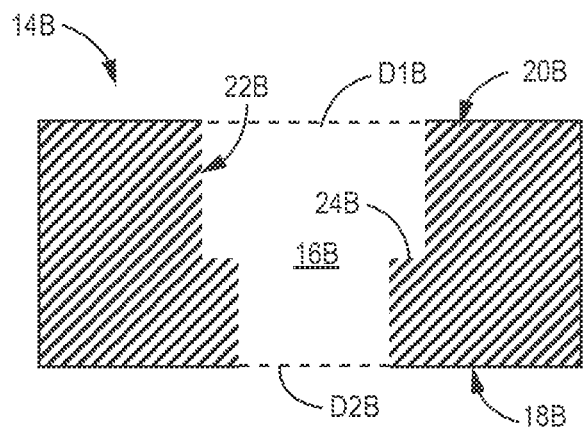
Figure 2C:
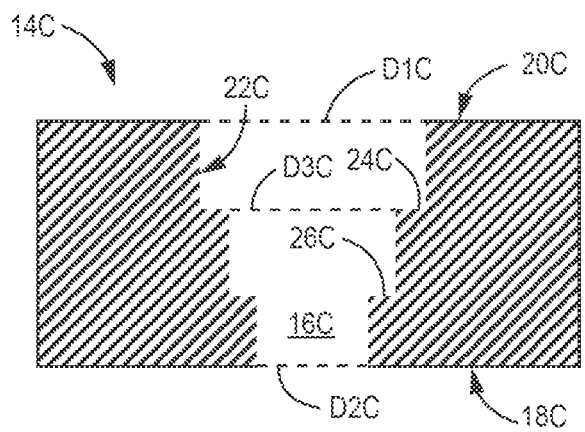

FIGS. 2A, 2B, and 2C are simplified enlarged cross-sectional illustrations of alternatively-shaped holes 16A, 16B, and 16C, respectively, for a tooling assembly. FIGS. 2A, 2B, and 2C are discussed together.

FIG. 2A illustrates hole 16A of plate 14A. As shown in FIG. 2A, hole 16A has a frustoconical cross-sectional geometry, substantially similar to hole 16 shown in FIG. 1. Hole 16A has a first dimension, D1A, at outer surface 20A of plate 14A, and a second dimension D2A at inner surface 18A. Dimensions D1A and D2A are hole-defining dimensions, and can for example be diameters in an exemplary embodiment wherein holes 16A are circular. More generally, the dimensions can be widths characterizing openings of non-circular holes. Hole 16A tapers inward, with D1A being greater than D2A. Hole 16A further includes continuously tapered sidewalls 22A extending between inner surface 18A and outer surface 20A. In the embodiment depicted in FIG. 2A, sidewalls 22A taper linearly from outer surface 20A to inner surface 18A. In an alternative embodiment, sidewalls 22A can have a curvilinear profile. Hole 16A can be formed, for example, using a laser or mechanical drilling technique. Mechanical drilling can involve the use of a tapered head or bit.

FIGS. 2B and 2C depict embodiments with holes converging from outer surfaces 20B, 20C to inner surfaces 18B, 18C in a stepwise fashion. FIG. 2B illustrates alternatively-shaped hole 16B within plate 14B. As shown in FIG. 2B, hole 16B has a stepped cross-sectional geometry with a single shoulder 24B in sidewall 22B, with the portion of hole 16B between outer surface 20B and shoulder 24B representing the counterbore. The ratio of the length of the non-counterbore portion (i.e., from shoulder 24B to inner surface 18B) and the counterbore portion of hole 16B can range from 1:1 to 1:5. Like hole 16A, hole 16B includes first diameter D1B at outer surface 20B and second diameter D2B at inner surface 18B, with first diameter D1B being greater than second diameter D2B.

FIG. 2C illustrates second alternatively-shaped hole 16C within plate 14C. Hole 16C is similar to hole 16B in that it has a stepped cross-sectional geometry, although hole 16C includes sidewall 22C with two shoulders, 24C and 26C. As such, the portion of hole 16C between outer surface 20C and shoulder 24C is a first counterbore portion, and between shoulder 24C and shoulder 26C is a second counterbore portion. The ratio of the non-counterbore portion of hole 16C to the second counterbore portion and first counterbore portion can range from 1:1:1 to 1:2:2. Hole 16C also includes first diameter D1C at outer surface 20C and second diameter D2C at inner surface 18C, with first diameter D1C being greater than second diameter D2C. Hole 16C further includes third diameter D3C defined by shoulder 24C, and continuous between shoulders 24C and 26C. Diameter D3C can be less than diameter D1C, but greater than diameter D2C. Holes 16B and 16C can be formed using a counterboring technique after an existing cylindrical hole is formed via drilling or other suitable process. One counterbore forms each shoulder (i.e., 24B, or 24C and 26C). In an alternative embodiment of either stepped hole 16B or 16C, segments of sidewalls 22B or 22C can be angled and/or curved while still maintaining a stepped geometry, for example, using countersinking instead of counterboring.

In the embodiments of 2A-2C, diameters D1A-D1C can be 1.1 to 4 times greater than respective second diameters D2A-D2C. The particular diameters selected can be based on, for example, a desired relationship between L and D, where L is hole length, defined at least partially by thickness T, and D is hole diameter. Tool assembly 10 can further incorporate any or each of plates 14A-14C with corresponding holes 16A-16C, and in some embodiments, holes 16A, 16B, and/or 16C can be incorporated into a single plate 14.

Each of holes 16A-16C is generally tapered, as the hole diameter decreases between respective outer surfaces 20A-20C and respective inner surfaces 18A-18C. During CVI, where reactant vapors flow or diffuse through holes 16A-16C toward preform 12, reactants may deposit more quickly in the hole regions near the respective outer surfaces 20A-20C. With the uniform cylindrical holes used in current tooling, such deposits eventually accumulate and severely shrink the holes such that reactant vapors cannot be infiltrated through the holes effectively. However, due to the relatively greater diameters D1A-D1C, such accumulation takes longer to make respective holes 16A-16C inaccessible to reactant vapors, thus tooling assembly 10 with such holes can be used for more CVI cycles than traditional tooling.

Tooling assembly 10 can be used when infiltrating preform 12, via CVI, to deposit interface coatings (e.g., layers of BN, SiC, Si-doped BN, etc.) and/or to form a matrix (e.g., SiC) to create a CMC part. Such CMC parts can be incorporated into aerospace, maritime, or industrial equipment, to name a few, non-limiting examples.

Discussion of Possible Embodiments

The following are non-exclusive descriptions of possible embodiments of the present invention.

A tooling assembly suitable for use in infiltrating a fibrous preform comprises a first perforated plate having an outer surface and an oppositely disposed inner surface defining a plate thickness therebetween, and a plurality of tapered holes extending through the thickness. Each hole of the plurality of tapered holes has a first diameter at the outer surface and a second diameter at the inner surface, and the first diameter is greater than the second diameter.

The tooling assembly of the preceding paragraph can optionally include, additionally and/or alternatively, any one or more of the following features, configurations and/or additional components:

In the above tooling assembly, the first perforated plate can have a planar geometry.

In any of the above tooling assemblies, the first perforated plate can be formed from at least one of graphite, non-graphitic carbon, and silicon carbide.

In any of the above tooling assemblies, the first diameter can be 1.1 to 4 times greater than the second diameter.

In any of the above tooling assemblies, each hole of the plurality of tapered holes can have a frustoconical cross-sectional geometry.

In any of the above tooling assemblies, each hole of the plurality of tapered holes can include a continuous linear sidewall extending between the outer surface and the inner surface of the first perforated plate.

In any of the above tooling assemblies, each hole of the plurality of tapered holes can have a stepped cross-sectional geometry.

In any of the above tooling assemblies, each hole of the plurality of tapered holes can include a sidewall extending between the outer surface and the inner surface of the first perforated plate, and the sidewall can include a first shoulder portion.

In any of the above tooling assemblies, the sidewall can include a second shoulder portion.

In any of the above tooling assemblies, the thickness of the first perforated plate ranges from 0.25 in (6.35 mm) to 1.0 in (25.4 mm).

Any of the above tooling assemblies can further include a second perforated plate having an outer surface and an oppositely disposed inner surface defining a plate thickness, and a plurality of tapered holes extending through the thickness. Each hole of the plurality of tapered hole can have a first diameter at the outer surface and a second diameter at the inner surface, and the first diameter can be greater than the second diameter.

A method of forming a tooling assembly suitable for use in infiltrating a fibrous preform comprises forming a first perforated plate, the first perforated plate having an outer surface and an oppositely disposed inner surface defining a plate thickness therebetween, and a plurality of tapered holes extending through the thickness. Each hole of the plurality of tapered hole has a first diameter at the outer surface and a second diameter at the inner surface, and the first diameter is greater than the second diameter.

The method of the preceding paragraph can optionally include, additionally and/or alternatively, any one or more of the following features, configurations and/or additional components:

In the above method, forming the first perforated plate can include forming each hole of the plurality of tapered holes using a drilling technique.

In any of the above methods, each hole of the plurality of tapered holes can include a continuous linear sidewall extending between the outer surface and the inner surface of the first perforated plate.

In any of the above methods, forming the first perforated plate can further include counterboring each hole.

In any of the above methods, each hole of the plurality of tapered holes can include a sidewall extending between the outer surface and the inner surface of the first perforated plate, and the sidewall can include a first shoulder portion.

Any of the above methods can further include further counterboring each hole such that the sidewall comprises a second shoulder portion.

A tooling assembly suitable for use in infiltrating a fibrous preform comprises a a plurality of perforated plates, each having an outer surface and an oppositely disposed inner surface defining a plate thickness therebetween, and a plurality of tapered holes extending through the thickness. Each hole of the plurality of tapered holes has a first diameter at the outer surface and a second diameter at the inner surface, and the first diameter is greater than the second diameter.

The tooling assembly of the preceding paragraph can optionally include, additionally and/or alternatively, any one or more of the following features, configurations and/or additional components:

In the above tooling assembly, for at least one of the plurality of perforated plates, each hole of the plurality of tapered holes can have a frustoconical cross-sectional geometry.

In any of the above tooling assemblies, for at least one of the plurality of perforated plates, each hole of the plurality of tapered holes can have a stepped cross-sectional geometry.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A tooling assembly suitable for use in infiltrating a fibrous preform, the tooling assembly comprising:
   a plurality of perforated plates, each of the plurality of perforated plates formed from graphite and comprising:
      an outer surface and an oppositely disposed inner surface defining a plate thickness therebetween; and
      a plurality of tapered holes extending through the thickness;
   wherein the tooling assembly is configured to enclose the fibrous preform such that the inner surface of each of the plurality of perforated plates faces the fibrous preform and to maintain a shape of the fibrous preform during a chemical vapor infiltration process;
   wherein each hole of the plurality of tapered holes has a first diameter at the outer surface and a second diameter at the inner surface; and
   wherein the first diameter is greater than the second diameter.

2. The tooling assembly of claim 1, wherein each of the plurality of perforated plates has a planar geometry.

3. The tooling assembly of claim 1, wherein the first diameter is 1.1 to 4 times greater than the second diameter.

4. The tooling assembly of claim 1, wherein each hole of the plurality of tapered holes has a frustoconical cross-sectional geometry.

5. The tooling assembly of claim 4, wherein each hole of the plurality of tapered holes comprises a continuous linear sidewall extending between the outer surface and the inner surface of the first perforated plate.

6. The tooling assembly of claim 1, wherein each hole of the plurality of tapered holes has a stepped cross-sectional geometry.

7. The tooling assembly of claim 6, wherein each hole of the plurality of tapered holes comprises a sidewall extending between the outer surface and the inner surface of the first perforated plate, and wherein the sidewall comprises a first shoulder portion.

8. The tooling assembly of claim 7, wherein the sidewall comprises a second shoulder portion.

9. The tooling assembly of claim 1, wherein the thickness of each of the plurality of perforated plates ranges from 0.25 in (6.35 mm) to 1.0 in (25.4 mm).

10. The tooling assembly of claim 1, wherein each of the plurality of perforated plates has a geometry complimentary to a geometry of the fibrous preform.

11. A method of forming a tooling assembly suitable for use in infiltrating a fibrous preform, the method comprising:
    forming a plurality of perforated plates from graphite, each of the plurality of perforated plates comprising:
       an outer surface and an oppositely disposed inner surface defining a plate thickness therebetween; and
       a plurality of tapered holes extending through the thickness;
    wherein the tooling assembly is configured to enclose the fibrous preform such that the inner surface of each of the plurality of perforated plates faces the fibrous preform and wherein each of the plurality of perforated plates has a geometry complimentary to a geometry of the fibrous preform;
    wherein each hole of the plurality of tapered hole has a first diameter at the outer surface and a second diameter at the inner surface; and
    wherein the first diameter is greater than the second diameter.

12. The method of claim 11, wherein forming the plurality of perforated plates comprises forming each hole of the plurality of tapered holes using a drilling technique.

13. The method of claim 12, wherein each hole of the plurality of tapered holes comprises a continuous linear sidewall extending between the outer surface and the inner surface of the first perforated plate.

14. The method of claim 12, wherein forming the plurality of perforated plates further comprises counterboring each hole.

15. The method of claim 14, wherein each hole of the plurality of tapered holes comprises a sidewall extending between the outer surface and the inner surface of the first perforated plate, and wherein the sidewall comprises a first shoulder portion.

16. The method of claim 15 and further comprising: further counterboring each hole such that the sidewall comprises a second shoulder portion.

17. A tooling assembly suitable for use in infiltrating a fibrous preform, the tooling assembly comprising:
    a plurality of perforated plates, each perforated plate formed from graphite and comprising:
       an outer surface and an oppositely disposed inner surface defining a plate thickness therebetween; and
       a plurality of tapered holes extending through the thickness;
    wherein the tooling assembly is configured to enclose the fibrous preform such that the inner surface of each of the plurality of perforated plates faces the fibrous preform, and wherein each of the plurality of perforated plates has a geometry complimentary to a geometry of the fibrous preform;

wherein each hole of the plurality of tapered holes has a first diameter at the outer surface and a second diameter at the inner surface;

wherein the first diameter is greater than the second diameter; and wherein for at least one of the plurality of perforated plates, each hole of the plurality of tapered holes has a stepped cross-sectional geometry.

\* \* \* \* \*